United States Patent [19]
Rivera

[11] Patent Number: 5,508,633
[45] Date of Patent: Apr. 16, 1996

[54] METHOD OF AND APPARATUS FOR TESTING AND ADJUSTING D.C. ROTARY MACHINES

[76] Inventor: Nicholas N. Rivera, P.O. Box 565, Vienna, Va. 22180

[21] Appl. No.: 292,212

[22] Filed: Aug. 19, 1994

[51] Int. Cl.$^6$ ..................................................... G01R 31/34
[52] U.S. Cl. ........................... 324/772; 324/545; 340/648
[58] Field of Search ..................................... 324/772, 545; 318/138, 254; 340/648

[56] References Cited

U.S. PATENT DOCUMENTS

| | | | |
|---|---|---|---|
| 2,752,568 | 6/1956 | Ward | 324/772 |
| 4,342,960 | 8/1982 | Sawada | 318/490 |
| 4,658,213 | 4/1987 | Finley | 324/772 |
| 5,132,602 | 7/1992 | Jorgensen et al. | 324/772 |

OTHER PUBLICATIONS

Fowle, Standard Handbook for Electrical Engineers, pp. 892 to 899, (1933), published by Mc–Graw Hill Book Co., Inc., New York, N.Y.

NAVSEA S9310–AC–HBK–010, Commutator/Slip Ring Maintenance Handbook, pp. 4–28 to 4–34, Aug. 1985, published by U.S. Navy, Washington, D.C.

IEEE GUIDE: Test Procedures to Direct Current Machines, pp. 7 to 39, Aug. 1985, published by The Institute of Electrical and Electronic Engineers, Inc., 345 East 47th Street, New York, N.Y. 10017.

*Primary Examiner*—Ernest F. Karlsen
*Assistant Examiner*—Russell M. Kobert
*Attorney, Agent, or Firm*—William D. Hall

[57] ABSTRACT

Apparatus may be inserted in the casing of a d.c. motor or a d.c. generator for measuring not only the magnetic fields prevailing in the machine but developing other useful information. The magnetic fields between the field poles and the armature, and also the armature/mmf fields aligned with the brushes may be measured. The measurements of the fields permits a complete plot of the fields in the machine and also permits a test to be performed to see if the brushes are at their optimum positions. If a brush is not at its optimum position, the brush may be shifted back and forth until the maximum mmf, due to the current through the armature is aligned midway between the leading and trailing ends of the brush area coverage on the commutator.

20 Claims, 12 Drawing Sheets

METHOD OF AND APPARATUS FOR TESTING AND ADJUSTING D.C. ROTARY MACHINES

BACKGROUND OF THE INVENTION

The inventions shown and described herein relate to methods of and apparatus for testing and adjusting direct current rotating machines such as motors and generators.

One of the problems involved in testing and adjusting d.c. machines is to select the proper positions for the brushes. Many years ago a brush was shifted back and forth in an effort to find the best position. As stated in the text Electrical Machinery, by Fitzgerald and Kingsley, published by McGraw-Hill Book Co. (1952), at page 241:

"Shifting the brushes was at one time a common way of securing good commutation. The method is now obsolete, however."

The heart of a d.c. machine is the armature. All power conversion energy flows through it, and its capability to convert mechanical rotation from or to undirectional currents and magnetic fields is largely controlled by geometrical factors. This means that the coupling medium comprised of the air gap magnetic field should be marshalled into perfectly symmetrical areas through which energy is allowed to flow (the main poles) and out of other areas where the commutation process must take place (the commutation zones).

The armatures of d.c. machines may be lap or wave wound. The armatures have multiple parallel current paths, one or more paths per pole for those having simplex or multiplex windings. If the air gap magnetic fluxes are perfectly symmetrical, the parallel currents should have equal magnitudes a factor that should contribute to good commutation. Asymmetrical air gap conditions will result in unbalanced currents.

Under steady load conditions, the currents that flow from the positive to the negative pole brushes are continuous. However, internal to each brush and at the commutator-to-brush interface the currents are continuously changing. There are three current components, two of which must be minimized or ideally, completely eliminated for good commutation. These are described below:

The armature load current is divided proportionately between the commutator bar areas bridged by the brush. The shorted coils provide a low resistance bypass such that the current division between the bars shorted by the brush is controlled by the brush-to-bar contact resistance, which is proportional to contact area. Under this condition alone the rate of change of current across the brush face is uniform resulting in uniform brush contact temperatures.

Armature parallel path imbalance currents are caused by asymmetrical air gap conditions and improper positioning of the brushes. These currents are divided between the shorted coils and the brush contact areas. Since these currents must flow from one side of the armature to the other they result in increased current densities toward the leading or lagging edges of the brushes. Since high current densities cause high contact temperatures which in turn lower the brush contact resistance and further increase current densities, the current imbalances result in sparking and burning of the brush contact faces and commutator surfaces.

SUMMARY OF THE INVENTION

The current flowing to and from the armature winding, of a d.c. rotating machine such as a motor or generator, produces a magnetomotive force (mmf) that produces a magnetic field. This mmf varies from the leading end to the trailing end of a brush. This current flows through the risers that are adjacent a given brush. The current flow through the riser produces a magnetic flux adjacent to the given brush. The risers, taken as a group, form a cylinder that is coaxial with the machine. A probe that detects magnetic fields is rotated about the axis of the machine, at a radius slightly greater than the radius of the risers. The magnetic fields produced by the currents flowing through the risers, that are adjacent a given brush, are sensed by a probe as the probe moves in its arc around the risers. The probe detects the relative positions of the magnetic field component of armature current adjacent the "given" brush. Thus, if a probe is rotated around an arc of a radius greater than the radius of the risers, it can find the angle where the magnetic field adjacent a given brush, is a maximum. I can then attempt to set the brush to the same angle around the axis of the machine as the angle of said maximum magnetic field reading. This attempt to set the brush at the maximum may change the angular position of the maximum flux. If so, I then readjust the angle of the brush, and/or probe several times, if needed, until the angle of the maximum field is the same as the angle of the midpoint between the leading and trailing ends of the portion of the brush that contacts the commutator. Such a brush setting will provide optimum commutation.

To assist in the testing of d.c. machines I have invented special apparatus as follows. I provide a ring coaxial with the axis of rotation of the machine. Probes and other devices on the ring can assist in the making of tests. With this special apparatus the field at any point, where knowledge of the magnitude of the field is useful, can be measured. To get the special apparatus into the casing, the apparatus enters through one or more holes in the casing, in disassembled form, and is assembled in the casing. The special apparatus feeds the information that it acquires to instruments, outside the casing, which process, display and record the information.

One purpose of the new method is to test and adjust a d.c. machine in order to eliminate destructive and other unwanted armature current components which flow through the commutator-brush contact areas.

The new method overcomes two specific problems:
1. It is not practical to achieve perfectly symmetrical air gap flux distributions.
2. The armature circuit is a very high admittance network having as many current paths as there are poles. The high parallel admittances make it impractical to control the current distributions and balances by conventional methods.

My new method overcomes the above problems by correlating air gap field distributions with armature current distributions and making adjustments which eliminate the destructive and unwanted current component flows.

DETAILED DESCRIPTION

In the practices of my new method, I prefer to use particular apparatus which I will describe before the method is described. The method can be performed with apparatus other than that described below.

I will describe my test apparatus as well as the test method, as applicable to a 200 HP d.c. motor having either a wave or lap wound armature. The invention is, however, applicable to any d.c. motor or generator, irrespective of the type of the armature winding. The term "d.c. machine" is generic to both d.c. motors and generators.

Figure 1:
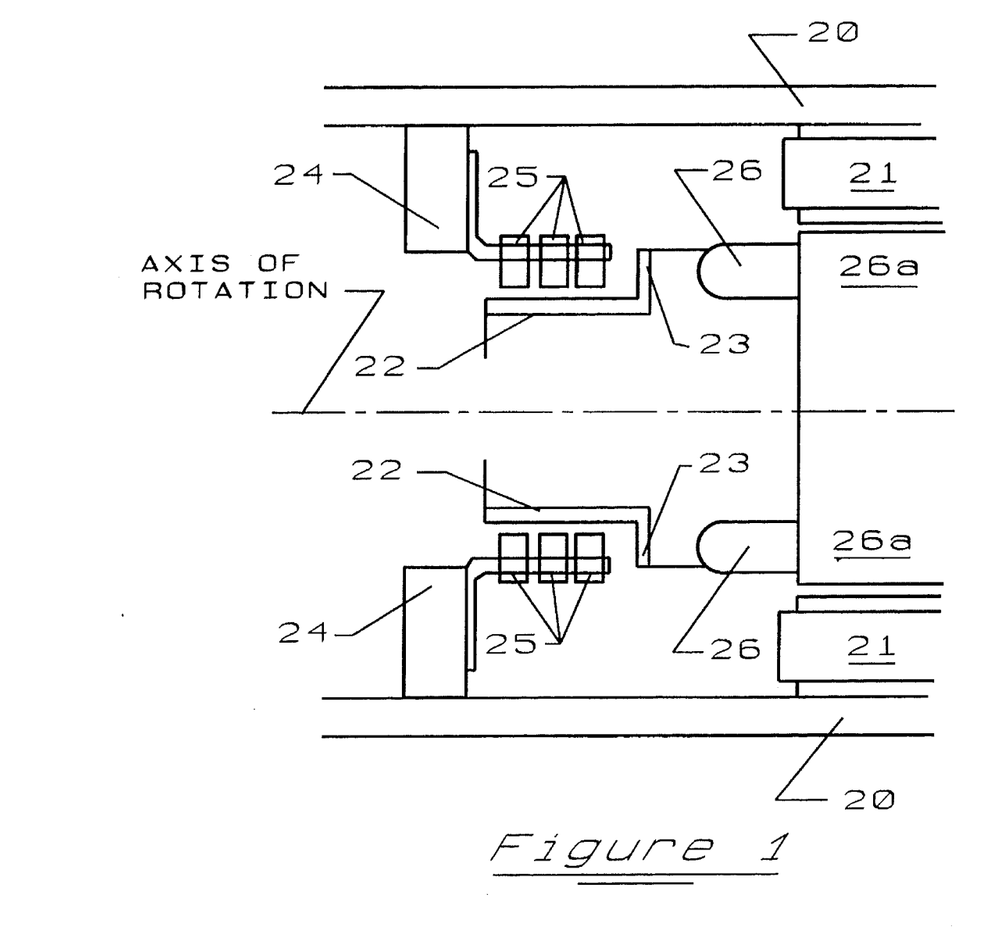
FIG. 1 is a schematic drawing of a typical d.c. machine on which the present method may be applied.
Figure 2:
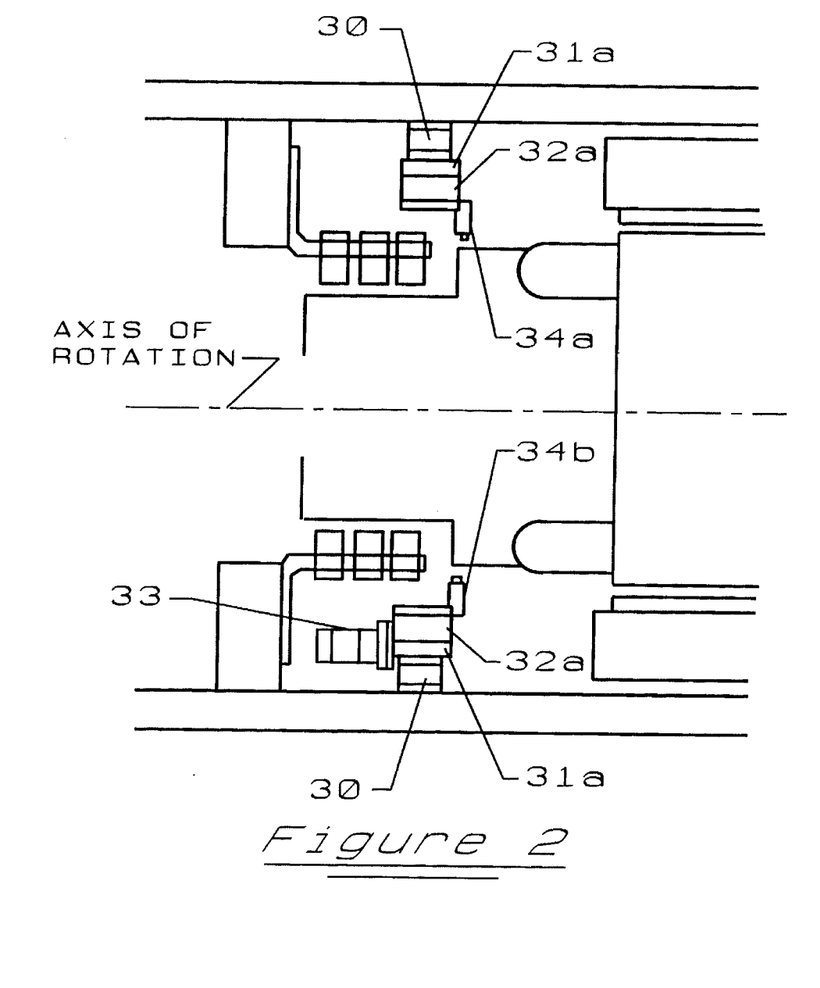
FIG. 2 is a schematic drawing similar to FIG. 1, except that it has my test apparatus installed therein.

FIGS. 1 and 2 show the frame 20 of the d.c. machine, the field pole piece 21, the commutator 22, the riser 23, the brush rigging 24, brushes 25, the portions 26 of the armature winding that connects to the commutator segments (not shown). It is customary to have one riser 23 for each commutator segment. The riser 23 electrically connects its complementary commutator segment to the proper armature winding. The armature 26a is mechanically connected to the commutator 22 and to the portions 26, so that all of these parts rotate together.

In order to facilitate my test method, I have added the parts described in this paragraph, to the d.c. machine. The expansion clamp 30 is attached to the frame 20 and is capable of expanding or contracting, under human control, so as to move support ring 31, positioning ring 32 and probe 34 toward or away from the axis of the machine. The probe 34 is mounted in a socket 36 on the positioning ring 32, so that the probe 34 may be inserted into or removed from the socket.

Figure 3:
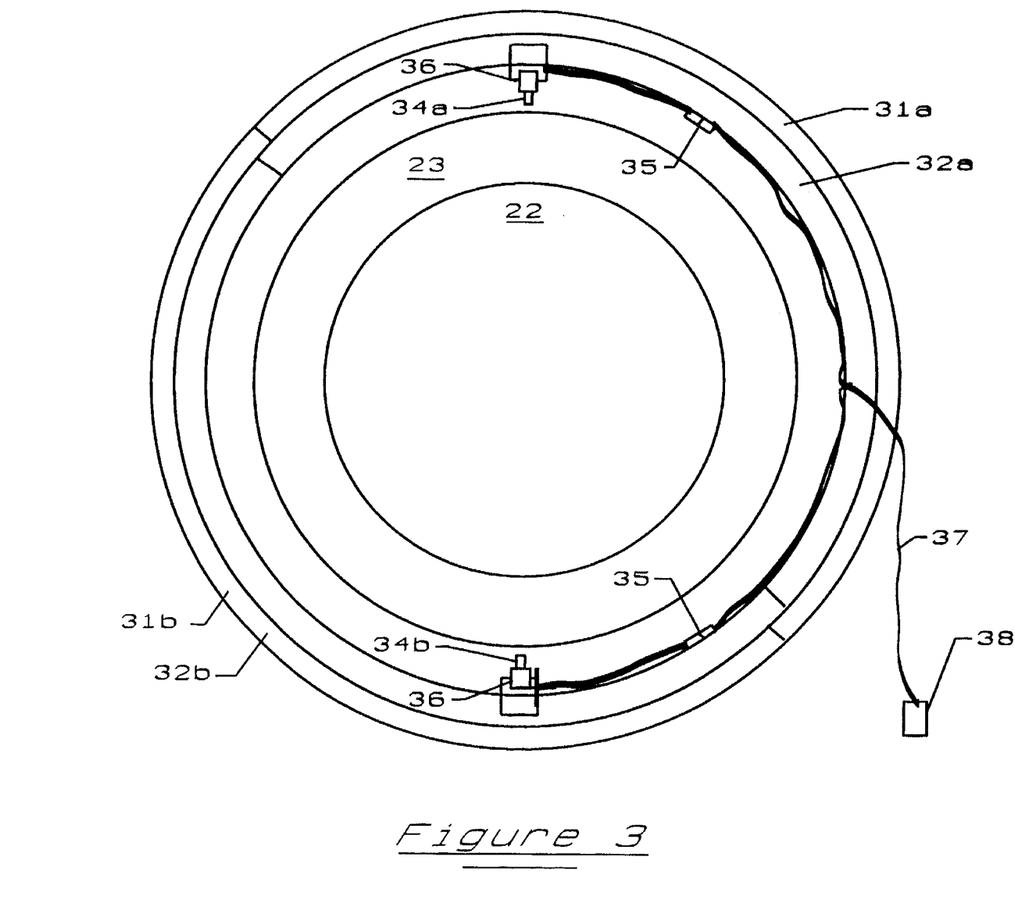
FIG. 3 is a front view of the test apparatus as installed in a machine.
Figure 9:
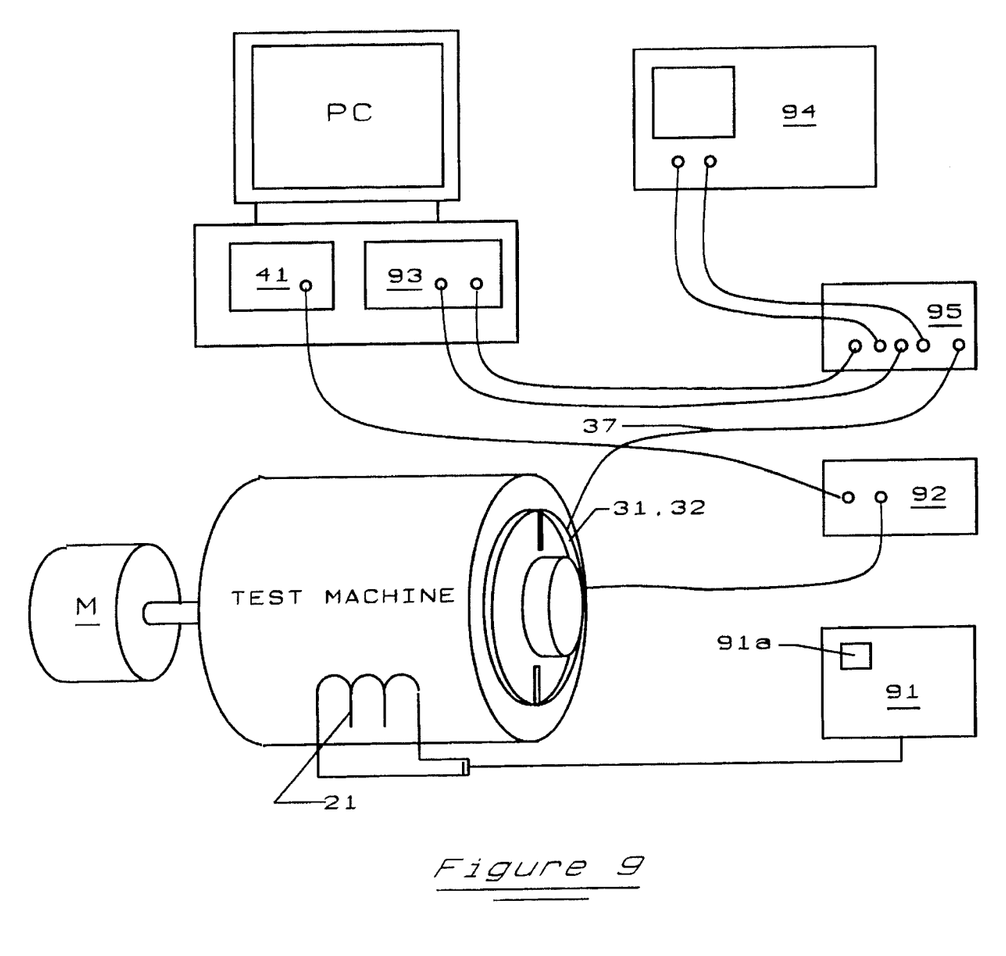
FIG. 9 is a block diagram of test equipment.
Figure 10:
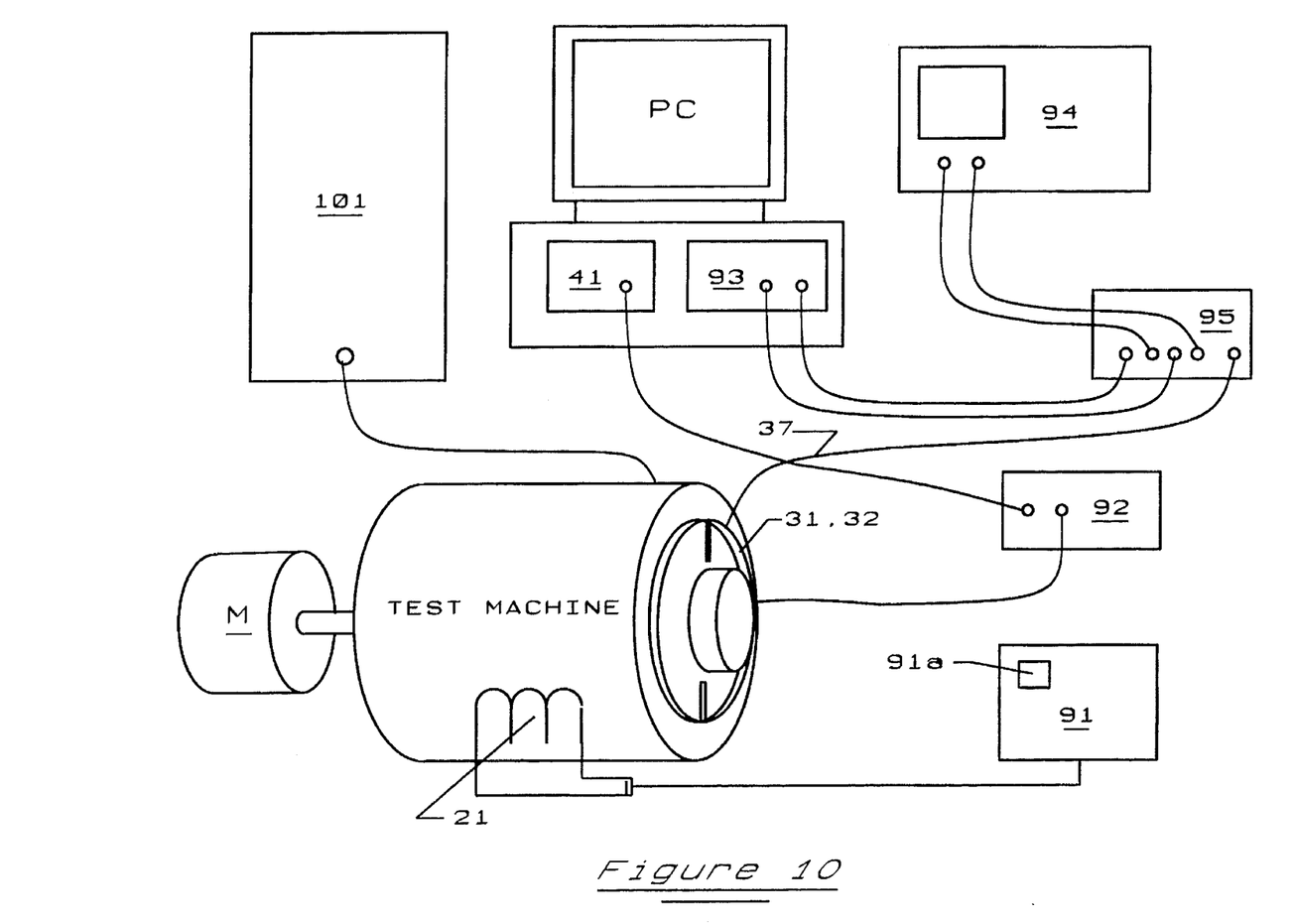
FIG. 10 is a block diagram of another form of test equipment.

There are two identical probes 34, namely probes 34a and 34b, exactly 180° apart as shown in FIG. 3. A permanent magnet 40 may be temporarily bonded to the riser 23. The positioning ring 32 is mounted for 360 degree angular motion about the axis of rotation of the armature. This angular motion is effected by motor and gearbox (FIG. 2). The motor and gearbox 33 is controlled by the controller 92 of FIGS. 9 and 10. The controller 92 may start, stop or reverse the angular motion of positioning ring 32. The apparatus of FIGS. 9 and 10 is, of course, something that I have added to the motor per se.

The apparatus 33 may take other forms, such as a stepping motor or a gearhead motor.

Figure 6:
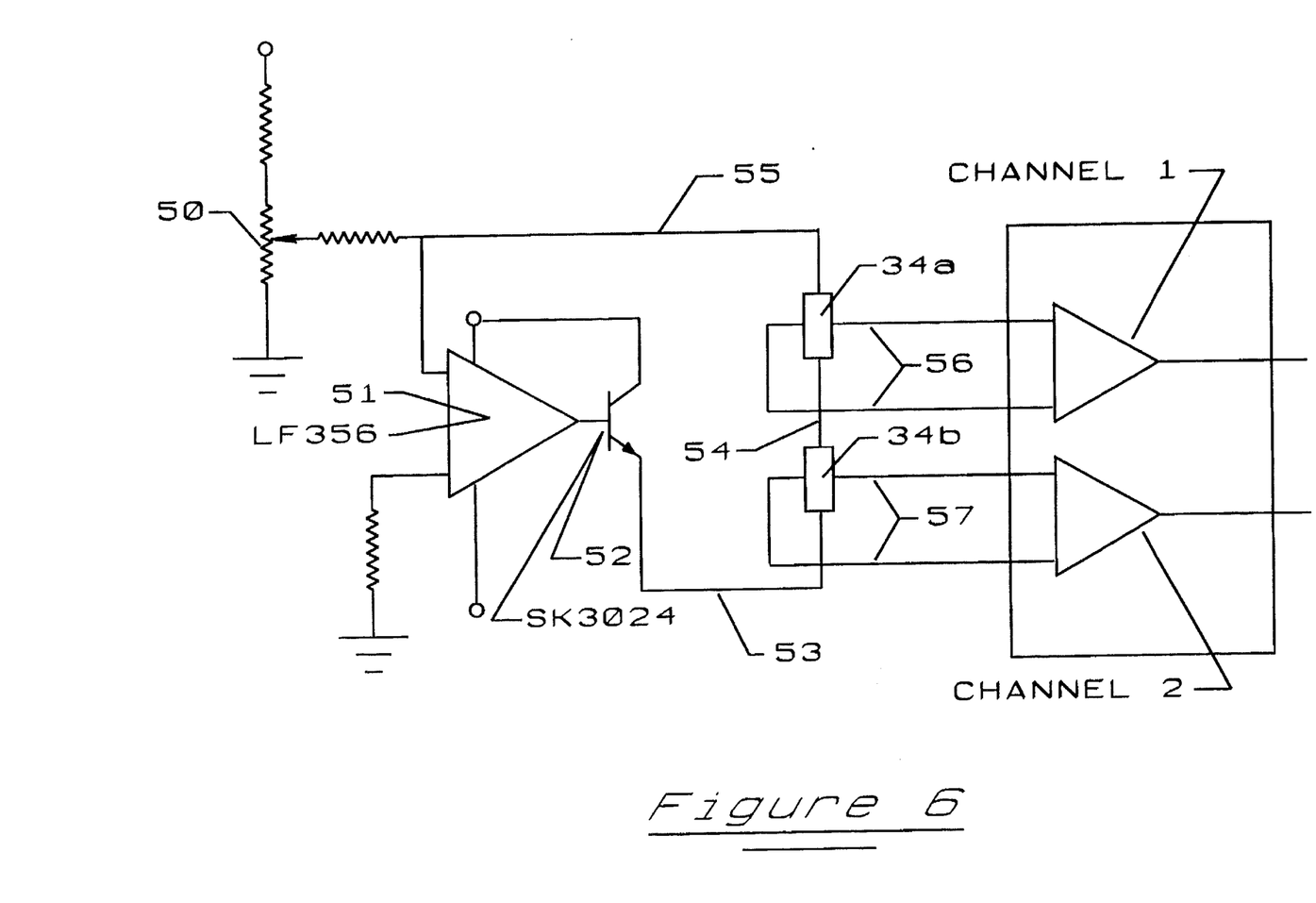
FIG. 6 is a schematic diagram of the circuitry associated with the two probes 34a and 34b.

In FIG. 6, the circuitry to the left of wires 53, 54 and 55 produces a constant current in wires 53, 54 and 55. The probes 34a and 34b are devices operating on the principle of the Hall effect and in each of these probes a constant current flows through the device; passing into pin 3 and out pin 1. When there is a magnetic field through such a probe, there is an output current flowing from one of pins 2 and 4 to the other of those pins. Thus, probes 34a and 34b each have an output related to the density of the magnetic field passing across the probe. The output circuit of probe 34a is hereinafter called Channel 1 and the output of probe 34b is hereinafter called Channel 2.

A suitable Hall effect probe 34 is manufactured by F. W. Bell, Model No. BH-200. A number of other manufacturers sell a suitable Hall effect generator. Indeed, any so-called Hall effect generator meeting IEEE Standard No. 296 will work.

The magnitude of the constant current, referred to above, is determined by potentiometer 50. The amplifier 51 (LF 356) controls the excitation of transistor 52 (SK 3024) to maintain the current in conductors 53, 54 and 55 constant.

Since the support ring 31 and the positioning ring 32 are not a part of the motor being tested, they must be added. Accordingly, the support ring 31 and the positioning ring 32 come in two parts each of which will extend around the axis of the motor for 180°. One of these two parts is 31a–32a. The other part is 31b–32b. These two parts are separately inserted through holes in the motor casing 20 and assembled in that casing to form a 360 degree support ring 31 and a positioning ring 32 extending for 360° around the motor axis. See FIG. 3. The support ring 31 is fixed to the casing and supports and guides ring 32 which rotates under the control of controller 92.

One of my tests uses a device (FIG. 12) which may be called a horizontal probe 34c. That probe has a construction and function similar to the probe 34a of FIGS. 3 and 6. This horizontal probe 34c is mounted on one end of a horizontal arm 48 that has another end 49 that fits in socket 36 on the positioning ring 32. The probe 34c extends into the air gap between any field pole piece and the armature. The probe 34c may be a Hall effect generator and be identical to probes 34a and 34b. Moreover, this horizontal arm 48 can be moved back and forth along lines parallel to the axis of rotation of the armature. Since this horizontal probe is mounted on the positioning ring 32 it may be rotated in an angular direction concentric to the axis of rotation. Thus, the horizontal probe may measure the magnetic field density at any point between any field pole and the armature.

An interpole, also known as a commutating pole, is a well known part of d.c. machines, for example, see the Standard Handbook for Electrical Engineers Sixth Edition (1933) published by McGraw-Hill Book Co., Secs. 8–54 to 8–58.

Figure 5:
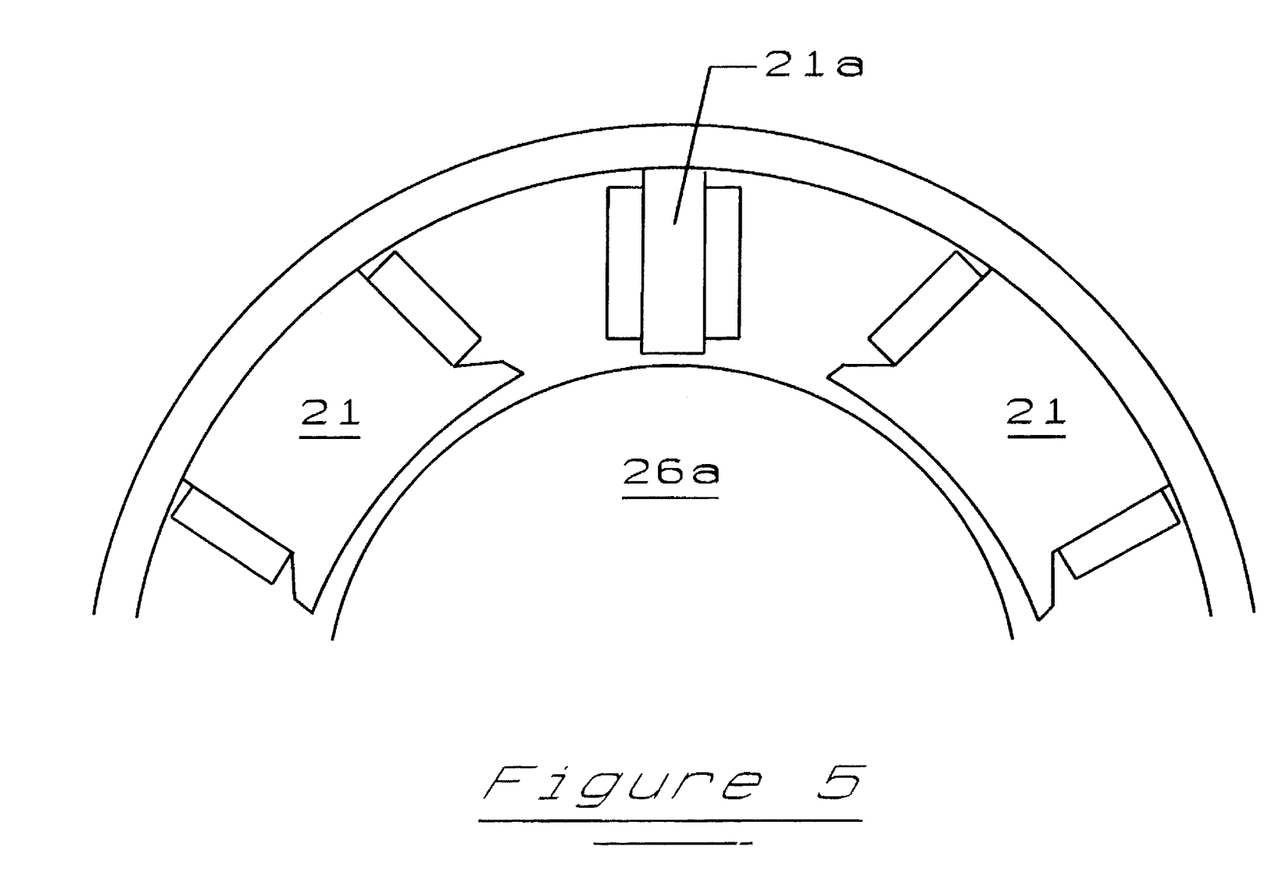
FIG. 5 is a schematic drawing of two field poles and an interpole of a d.c. machine.

The interpoles consist of narrow iron cores with coils which are series connected with the armature circuit and excited by the machine's load current. The interpoles are located between main poles of opposite polarity, thus their name. See interpole 21a of FIG. 5, for example.

The interpole neutralizes any residual flux in the commutating zone and supplies a small reverse flux sufficient to cancel the inductive effects.

In the description of my tests, as set forth below, it will be assumed that the d.c. machines under test have interpoles even though they are not shown.

Figure 11:
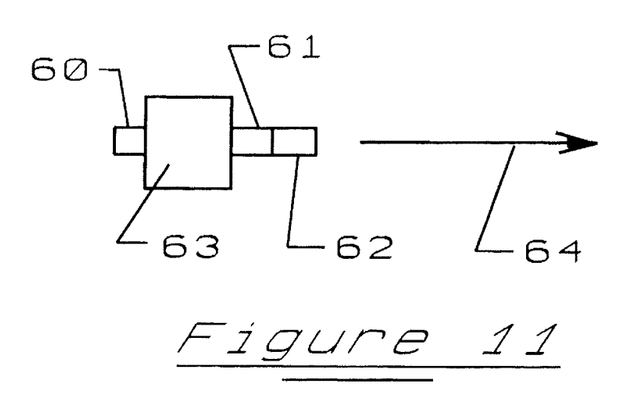
FIG. 11 is a block diagram of the laser pointer.

The laser pointer 62 (FIG. 11) is mounted on an arm 61 whose left end 60 includes a plug 63 that fits in socket 36 in place of the probe 34a. The laser pointer 62 emits a laser beam of very small width (0.5 mm) and which will rotate around the axis of rotation of the armature 26a. During such rotation the laser beam 64 is directed inwardly into the machine and will illuminate the side wall of the poles at points on the poles 21 at or very near their free ends. This very small beam of light 64 will be visible to the human eye and will permit the engineer making the test to see the spot on the poles illuminated by the beam 64. When the positioning ring 32 rotates about the axis of the machine the beam 64 forms a cylinder.

The laser pointer 62 (FIG. 11) is mounted on arm 61 and has a socket 60 that may be inserted in socket 36 but points its beam horizontally and at the free edges of the iron of the field poles 21. The positioning ring 32 may be rotated so that the beam 64 of the laser pointer defines a cylinder. The laser pointer 62 plus the digital counter 41 may be used to plot horizontal lines of FIG. 7. As the laser pointer 62 is rotated by positioning ring 32, the digital counter 41 counts. For example, the vertical line 45 (FIG. 7) is the starting position of the laser pointer 62 as it is rotated by ring 32. This starting position has a zero count on the digital counter 41. As the rotation of the laser pointer 62 by the positioning ring 32 progresses the digital counter 41 counts through the graduation marks on line 32 including counts 5, 10, 15 etc. As the laser beam 64 passes a first pole 21 of the d.c. machine it illuminates one end edge of that pole. The digital counter 41 is then read and let it be assumed that at that point the count on digital counter 41 is 1.0. Thereupon, the engineer makes a vertical mark 46 on FIG. 7. As the laser beam 64 advances further it illuminates the edge at the other end of the first pole and the engineer then observes the digital counter 41 and notes it is reading 8.0 and so he draws line 47 to represent said other end of the first pole 21. Therefore, the space between vertical lines 46 and 47 is span 48. The positioning ring 32 continues to rotate the laser pointer 62 until that pointer illuminates one edge of an interpole. The engineer notes that this occurs at count 9.0 and so he draws line 49 to represent one end of the first interpole (IP-1). Similarly, the other end of the first interpole is marked 50. Thus, span 51 represents the first interpole (IP-1).

Figure 7:
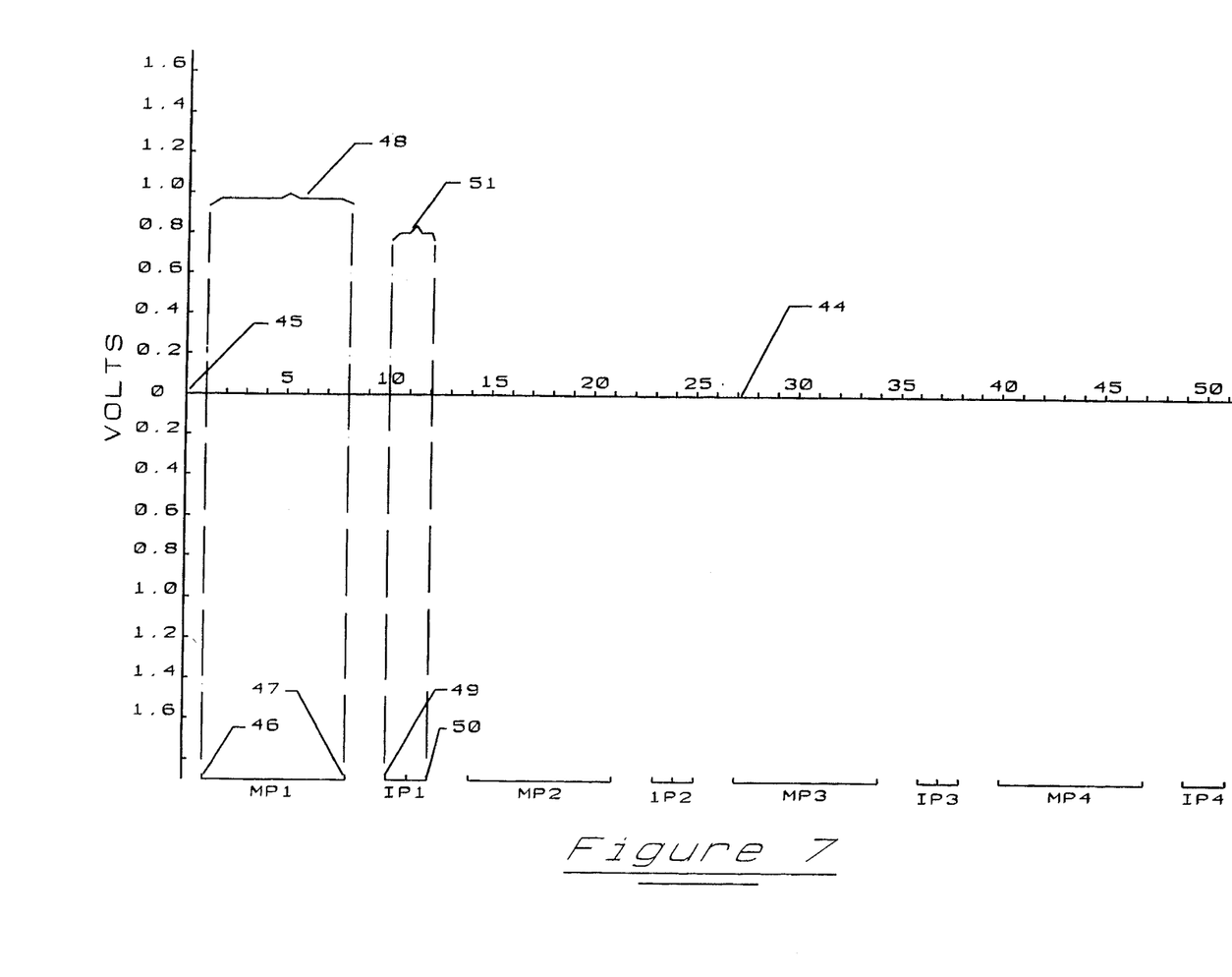
FIG. 7 is an air gap field mapping mat of a typical d.c. machine.

The process of plotting the map (line 44) of the d.c. machine under test then continues until the entire 360 degrees of the rotation of the positioning ring 32 and the laser pointer 62 is complete.

Figure 12:
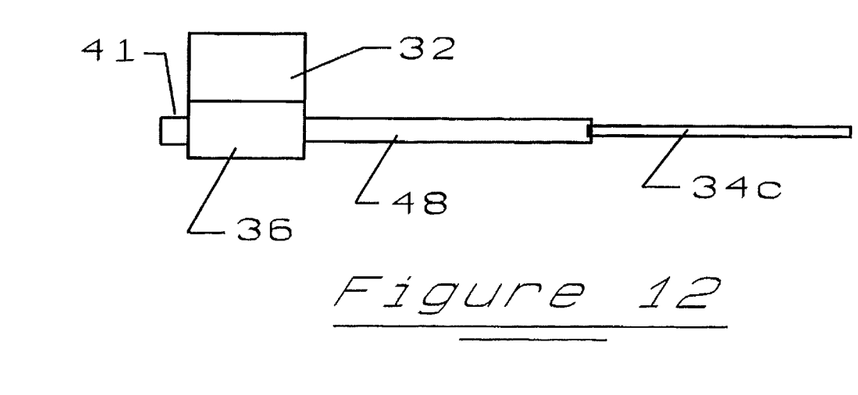
FIG. 12 is a block diagram of a so-called horizontal probe.
Figure 13:
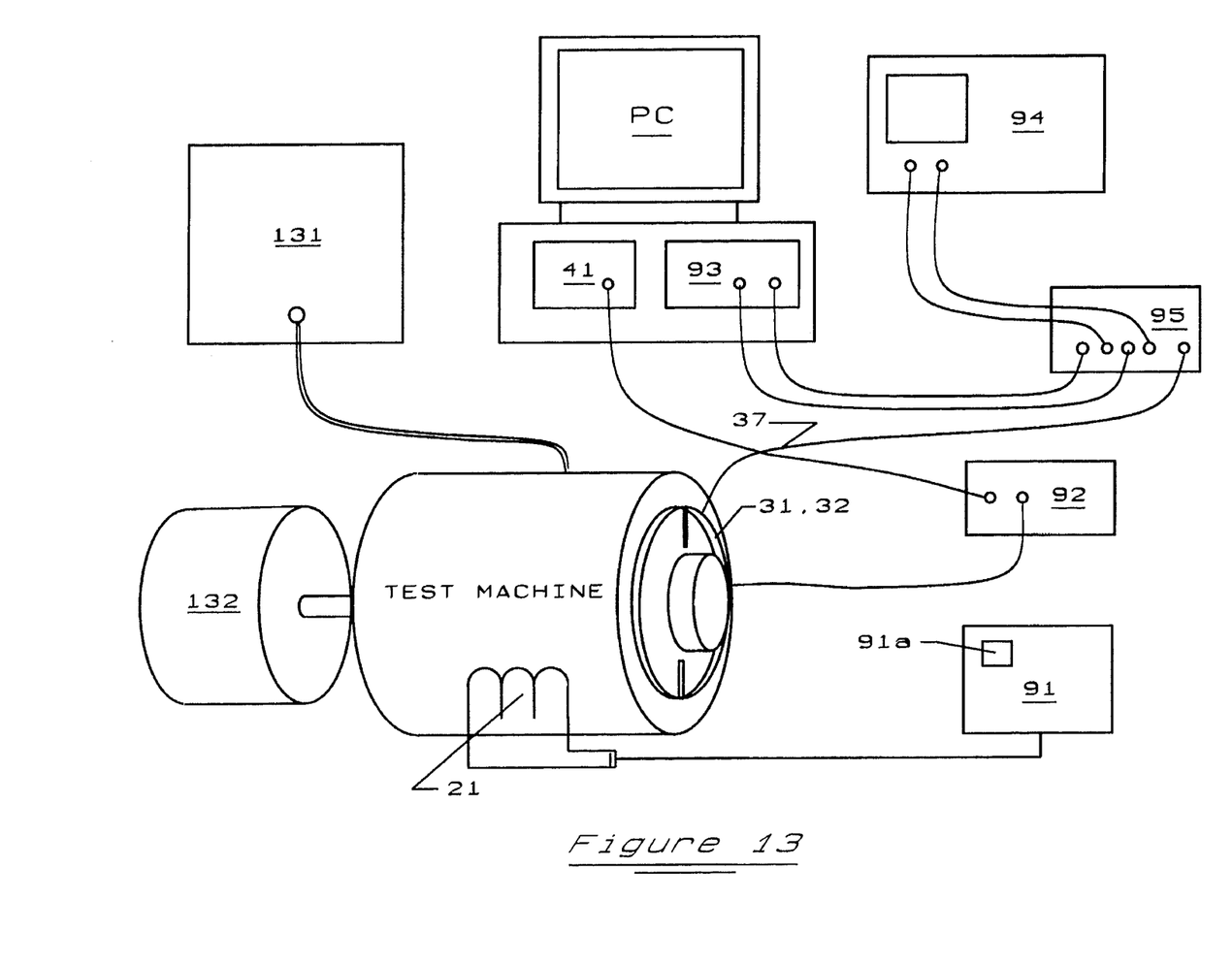
FIG. 13 is a block diagram of another form of test equipment.

After all of the poles and interpoles have been identified along line 44 of FIG. 7, it is now possible to determine the field strength at any point in the air gaps between field poles 21 and the armature 26a. This can be done by substituting the horizontal probe 34c for the laser pointer assembly (FIGS. 12, 13). The horizontal probe 34c may be positioned at any desired point in the air gap that is between the field poles 21 and the armature 26 as follows. The horizontal probe 34c may be moved back and forth parallel to the axis of the machine. Moreover, the probe 34c may be rotated in an arc by the positioning ring 32. The location of the probe 34c along the arc may be determined by reading the digital counter 41. For example, if the digital counter 41 reads 5, the angular position of probe 34c would be obtained by drawing a vertical line through number 5 on FIG. 7. This vertical line will intersect the first pole which covers span 48 of FIG. 7. Thus, the field strength may be measured at any point in the air gaps between the poles 21 and the armature 26a.

If tests with the probe 34c indicate that the fields produced by the field poles 21, and/or interpoles 21a, are imbalanced, correction may be made by well known conventional procedures.

Figure 8:
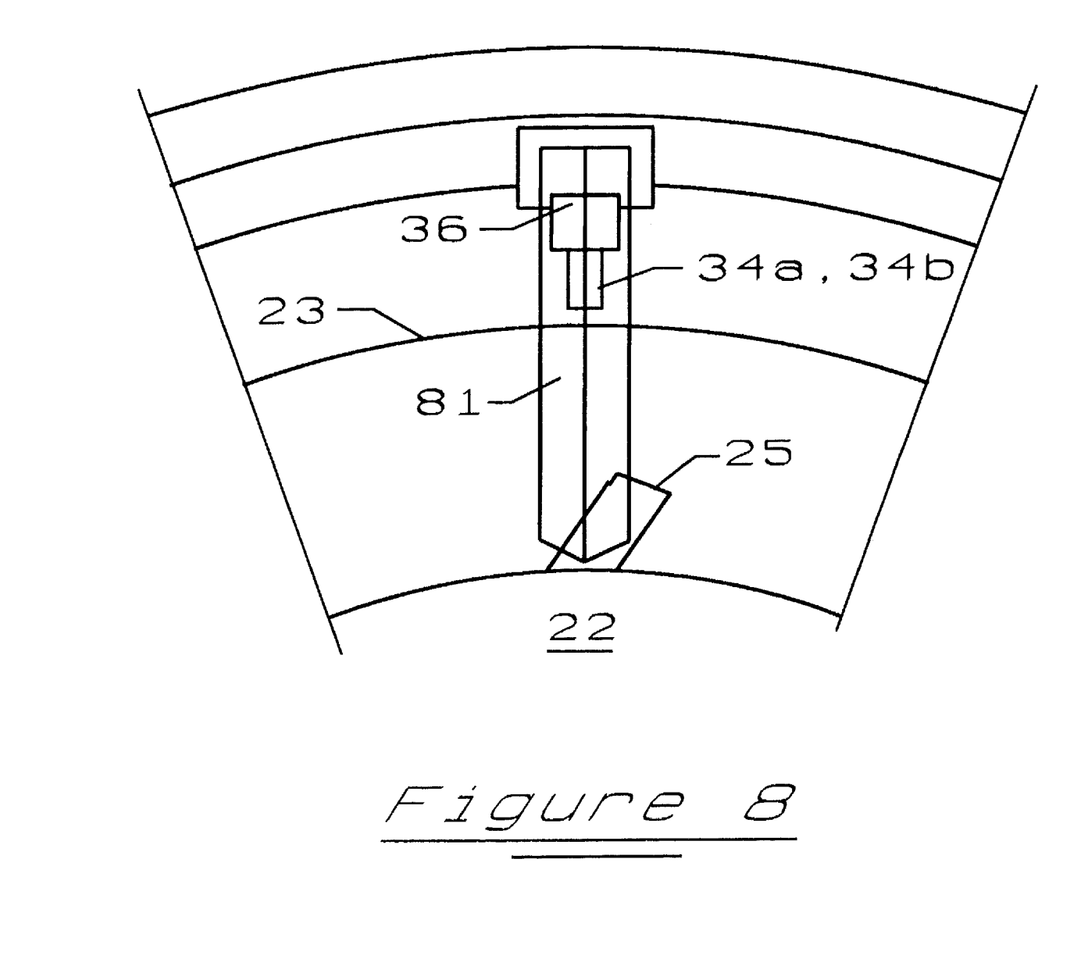
FIG. 8 is a diagram useful in explaining how to set a brush to its optimum position.

FIG. 8 shows how a brush 25 may be aligned with a probe 34a, or 34b. Socket 36 holds the probe 34a or 34b and is moved in a path adjacent to and concentric with riser 23. See FIGS. 1 and 2. The midpoint of the portion of the brush 25 which contacts the armature 22 is on a line parallel to the axis of rotation of the d.c. machine. That line in turn intersects a straight line through the probe which intersects the axis of rotation of the machine. If the angular position where the probe detects the maximum magnetic flux does not coincide with the angular position of the center of the brush footprint on the commutator, the pointer 81 provides visual indication of such displacement. Pointer 81 is attached to the socket 36 and moves with probe 34.

The words "brush footprint" refer to the area of the commutator that is in contact with the brush.

FIG. 9 is the apparatus used for mapping the air gap flux distribution (as hereinafter explained) and performing the "second test" hereinafter described. An external motor M drives the test machine at rated speed. The exciter 91 energizes the main field 21 at a suitable exitation current as indicated by ammeter 91a. A well known conventional controller 92 causes a gear motor drive 33 to move a positioning ring 32 (which carries the probe) such that the armature riser 23 may be scanned over 360 degrees. The digital counter 41 indicates the angular position of the probe 34. Cable 37 (FIGS. 3 and 9) carries channels 1 and 2 (see FIGS. 6 and 9) signals emanating from the probes 34 to the instrument amplifier 95. The amplified channels 1 and 2 signals are transmitted to the analog oscilloscope 94 and to the personal computer PC (which has a digital oscilloscope 93). The analog 94 and digital 93 oscilloscopes provide usable indication and recording of the data gathered by the probes 34.

FIG. 10 is the apparatus used for the "third test" hereinafter described. Similar parts of FIGS. 9 and 10 have similar reference numbers and they function in the manner described for FIG. 9. FIG. 10 has an additional part which is a load box 101 used to induce load currents in the test machine while it is externally driven as a generator.

FIG. 13 is the apparatus used for the "fourth test" hereinafter described. FIGS. 9, 10 and 13 have similar reference numbers for similar apparatus. Each of these parts of FIGS. 9, 10 and 13 have the same function and mode of operation. However, in FIG. 13, the electrical power source 131 drives the test machine as a motor, and dynamometer 132 acts as a load for the test machine.

Hereinafter, when I refer to data that represent values, it is to be understood that these would be the typical figures that an engineer would expect to use or find, as the case may be, in tests on the 200 HP d.c. machine referred to above.

Before my test procedures and adjustments are made the usual standard tests on the d.c. machine should be made as follows:

Visual inspection of insulation

Inspection and measurement of the commutator

Inspection and measurements of the brushes and brush holders

Insulation resistance measurements

Field winding resistance measurements

Air gap width measurements.

The tests described below evaluate the air gap magnetic fields and armature current flows, as the controlling factors of commutation and brush wear. These factors are geometrically interrelated, such that adjustments made to correct conditions indicated by one test may cause problems in other areas. This means that to get reliable results, the different tests and adjustments will need to be performed repeatedly as part of an iterative process. By this process the variables that need to be controlled are adjusted and tested, one at a time, until all variables coverage to within acceptable limits. This will happen after several iterations have been completed.

The first test that I will describe is one that evaluates the field in the air gap. The purpose of this test is to evaluate the uniformity and symmetry of all air gap magnetic fields by direct measurement and comparison methods. This test uses the following equipment previously described:

a. Oscilloscopes, Digital 93 and Analog 94
b. Instrument amplifier 95
c. Digital Counter. 41

The test equipment may be installed inside of the machine under test in accordance with the following:

Installation of positioning ring 32:

Preferred installation technique preferably should not disturb existing electromagnetic configuration of the machine, except for lifting of brushes.

Positioning ring 32 allows probe scanning of all relevant magnetic field and current flow distributions with the machine at rest and operating under load.

The probe cable 35, 37 is able to reel in and out unobtrusively to allow probe scanning of 360 mechanical degrees.

Positioning ring 32 installation is preferably adjusted to result in the following:

Probes to function in a plane perpendicular to armature's rotational axis within test instrument tolerance limits.

The positioning ring 32 is accurately centered. This will be accomplished dimensionally relative to the commutator riser 23 and with the help of the instrumentation system and a permanent magnet 40 affixed to the commutator riser 23 as a final refinement.

Installation of probes:

The preferred position of the probes 34 permits an engineer to detect either the air gap field, leakage static magnetic fields, or mmf's produced by currents flowing through the armature. Preferred detection of armature current mmf's will be in close proximity to armature winding connections 26 to the commutator risers 23.

Probe socket 36 shall be positioned such that a probe can be aligned axially with either the machine's main field poles, commutating poles or the brush footprint on the commutator. This shall be assisted by laser pointer 62, a mechanical pointer, or other visual aid capable of minimizing parallax errors.

The probes shall be oriented to result in perpendicular magnetic flux line detection at key positions relative to the static fields and armature current mmf's.

Calibration of instrumentation channels:

Channel 1 shall be designated as a reference and is bench calibrated for (a) zero offset and (b) a preselected gain with a specific probe.

Channel 2 calibration shall be matched to Channel 1 while installed in the machine. Calibration matching may be verified in four position quadrants. If calibration drifts in the four position quadrants, perpendicularity of the Hall probe relative to the axis of rotation must be corrected.

Figure 4:
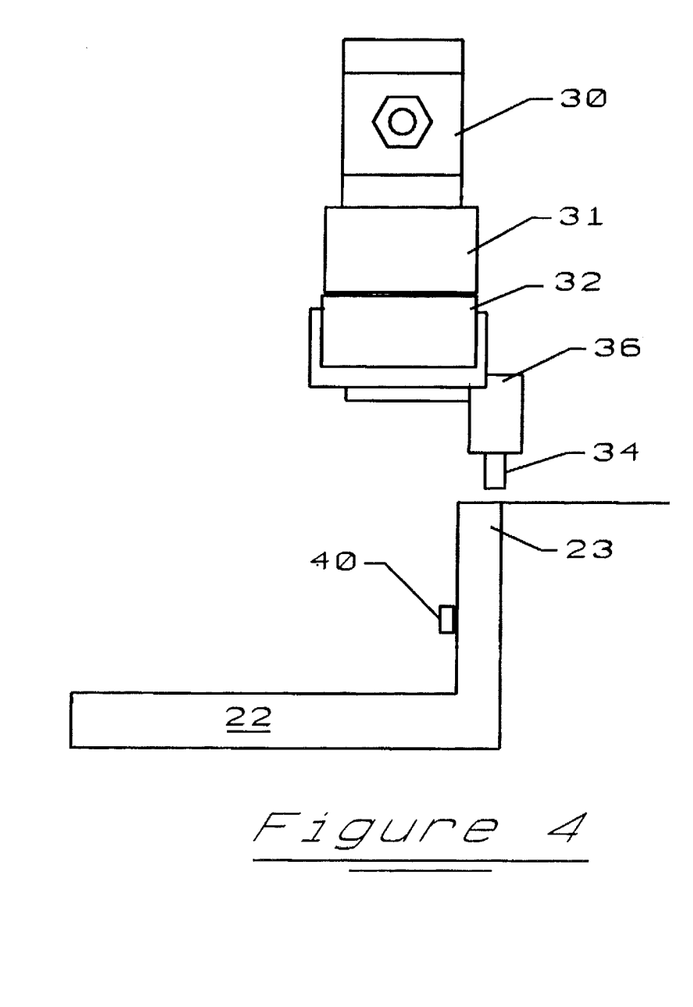
FIG. 4 is a schematic view of my test apparatus as applied to the commutator 22 and riser 23 of a typical d.c. machine.

The test procedure is as follows:

a. Lift all of the commutator brushes and install the test setup as indicated in FIG. 9. Install the positioning ring 32 as shown in FIGS. 2 to 8. Do not install the sensing probes 34 and cable 35, 37 at this time. Center the positioning ring 32 dimensionally by using the edges of the commutator risers 23 as reference points.

b. Thoroughly inspect the top surface of the armature 26a inside of the moving ring 32 of the positioning ring for obstructions (high points) to ensure adequate clearance for the probes.

c. Thoroughly check the installation of test components internal to the machine to prevent damage when the rotor is turned. Rotate the machine with the external drive to perform the steps that follow. This is required to cancel residual magnetism effects of the armature 26a.

d. Center the positioning ring 32 by use of the instrumentation setup as follows:

(1) Bond a permanent magnet 40 to the commutator risers 26 as shown in FIG. 4. Note: This step should be taken with enough lead time to ensure adequate drying or curing time for the bonding agent, say, several hours or a day in advance.

(2) Install probe 34a and cable 35, 37 as shown in FIG. 3. Install a bypass plug in the socket 35 for probe 34b to deactivate channel 2. Initial probe clearance from the top of the commutator riser 23 should be ample to avoid damage to the probe 34 from any high point on the armature surface. Cautiously rotate the positioning ring 32 with the gearhead motor drive 33 and controller 92 to verify probe clearances and note any spots where minimum clearances are observed. Verify probe clearance from the armature 26a by slowly spinning the rotor. Do this by bumping the external drive M with a quick on-off cycling of its motor starter.

(3) Rotate the armature with the external drive M.

(4) Using probe 34a, find the maximum signal produced by the magnet 40 and select oscilloscope settings for best resolution.

(5) Adjust centering of the positioning ring 32 until the signal amplitudes observed with probe 34a positioned at the top, bottom right and left are the same, within scope reading accuracy.

(6) Remove the permanent magnet 40.

(7) On the instrument amplifier 95 adjust the drive current as needed.

(8) Turn off the instrument amplifier 95 and remove the probe 34a.

(9) Install the provided laser pointer 62 in place of the probe 34a. Align the laser pointer 62 to spot the lower edges of the iron cores of the main poles 21 and interpoles.

The next steps of this first test are as follows:

a. Using the laser pointer 62, hereinabove explained, prepare a mapping matt of the field poles 21 and the interpoles, for future use by use of the computer plotter program, as explained below.

(1) Using the remote drive, initially position the laser beam 64 between a main pole 21 and an interpole with the probe cable 37 fully unreeled. Zero the digital counter 41 at this position. All subsequent reference points in the air gap map will be incremented from this position.

(2) Using the digital counter 41, determine the positions of the left and right edges of the main poles and interpoles, as shown in FIG. 7. Divide the spans of the main poles into an odd number of counts, say eleven, and of the interpoles, say three, for plotting resolution. A typical span is 48 on FIG. 7 and is the distance between the left and right edges of the iron portion of pole 21.

(3) Print the air gap reference map (FIG. 7) with the above identified position counts for use for field plotting.

Note: Evaluate the physical quartering of the main poles around the air gap and the centering of the interpoles between the main poles for use later in the procedure.

(4) Remove the laser pointer 62 and install the provided horizontal probe 34c.
(5) Center the horizontal probe 34c for a penetration of 1.0 inch from the front edge of a main pole 21 into the air gap.
(6) Turn on the instrument amplifier 95 and check proper instrument system operation.

b. Set the two oscilloscopes 93 and 94 for DC, 500 mv per division, and 1 ms per division.
c. Adjust the external field excitation source 91 for an output of 5.00 amperes, with all main poles energized.
d. Using the reference air gap map, the remote drive, the digital counter and the oscilloscope readings, plot the radial air gap field distribution. Record the probe signal levels and read at the reference points identified in step a as the air gap is scanned.
e. Print the radial air gap plot and evaluate the following (Correlate evaluation to physical quartering and centering as noted above):
(1) Accuracy of quartering main radial fields.
(2) Zero radial field crossing under the interpoles.
(3) Differences in amplitudes, shapes, and areas of the radial field poles.
f. Use the following acceptance criteria:
(1) Quartering of the main poles to be within a predetermined number of counts on the digital counter.
(2) Zero crossings at centers of interpoles.
(3) Main field amplitudes matched within five percent and areas matched within seven percent.
g. Turn off the instrument amplifier and remove the horizontal probe.

The second test is desirable in the event that the d.c. machine under test has 4, 8 or 12 poles and a lap wound armature. If this test is performed before my test to determine the optimum brush positions is run it will expedite the determination of best brush locations, when the d.c. machine is one of the types specified in the first sentence of this paragraph.

I will next explain the second test. This test is optional.

The second test will show good positions for the brushes—at which all currents, other than the load current, in the brushes are a minimum. The third test, which is described later will show an even better way to adjust the brushes. The armature of a d.c. machine may have circulating currents due to the fact that the emf's induced in the armature by the air gap field may not be symmetrical. The "second test" now to be described will characterize the circulating current and pin-point the location of the brushes at which the unwanted currents are a minimum.

To perform this "second test", an external driving/motor is employed to rotate the d.c. machine under test. The field of the d.c. machine under test is supplied by a d.c. source outside of the d.c. machine being tested. In the case of the 200 HP d.c. machine referred to above, the field is excited by 5.0 amperes by the external d.c. source 91.

As shown in FIGS. 1 and 2, each brush holder receives three brushes 25. For the purposes of this test, only the center one of the three brushes is used in two drametrically opposite brush holders. The brush holder in the said two diametrically opposite positions are then adjusted a small distance around the periphery of the commutator until the circulating current signal is reduced to a minimum.

The step of adjusting positions of the brush holders until the circulating current is minimized will now be explained in more detail.

If the brush holders, on the d.c. machine under test, are not individually adjustable around the periphery of the commutator, a substitute brush rigging should be provided which permits the desired adjustment. Both oscilloscopes 93, 94 of FIG. 9 should be set to: AC 20 mv, 2 ms., auto, triggered at approximately −8 mv. The probes 34a and 34b should be rotated (using the controller 92 and the positioning ring 32) until they are at the signal peaks as displayed on the analog scope. Record in the computer, for future reference, the signal traces that are on the computer oscilloscope, and enter in the file of the personal computer all pertinent information on the tests. At each of the positions at which each pair of brushes is tested, the following three steps should be repeated. (1) Set both scopes to 93, 94 to AC, 20 mv., 2 ms., auto, triggered at about −8 mv. (2) rotate the positioning ring 32 and set the probes 34a and 34b to the maximum signal positions as indicated on the analog oscilloscope, and (3) record the signal traces and all other pertinent data, in the computer PC.

The brushes may be set to positions in which the circulating current is a minimum, or zero, using the data taken during this second test. The procedure described above may be performed on each pair of brush sets until every brush has been set to a good position.

I will next describe the third test. If the d.c. machine under test has a lap wound armature and 4, 8 or 12 poles, the first step of this third test is to use the data obtained during the second test and determine which pair of brushes has the lowest circulating current signal level; this, however, is optional. After this brush pair has been selected, the second step is performed. Brushes are installed in the applicable brush holder so that the brushes of this brush pair are in their customary contact with the commutator. In the event that each brush holder is built to receive three brushes, only the center brush is installed for this third test.

After the pair of brushes (of the same polarity) has been installed, the third step occurs as follows: Install a third brush in a brush holder of opposite polarity to the polarity of the two brush pair. The fourth step is to set the computer scope 93 to DC, 200 mv/division, 1 ms., and the analog scope 94 to AC, 50 mv/division, 1 ms. Next, the fifth step uses an external motor M which rotates the machine under test at its normal operating speed. The sixth step is to gradually increase the load on the d.c. machine under test (while operating it as a generator), by decreasing the resistance of the load box 101 and/or increasing the field current (as shown in ammeter 91a) to the machine under test, until the machine under test is delivering a current to the load box of 100 amperes.

The seventh step of the third test involves rotating the positioning ring 32 to place probe 34a near radial alignment with said third brush after which the probe 34a is rotated, by positioning ring 32, back and forth a small amount so as to find the location in which it yields the maximum alternating voltage signal on the oscilloscopes. This is the optimum position for said third brush during normal operating conditions. That brush should now be set to the optimum position.

The positioning of the brush to its optimum position may be described in another way, thus: With the d.c. machine being operated as a generator and driven at its rated speed and load current, the probe 34a is rotated back and forth, by positioning ring 32, above the brush to determine the position at which the mmf through the brush is a maximum. The brush is then reset so that the maximum mmf passes through the brush midway between the leading and trailing end of the brush.

The ninth step is to save the signal traces on the computer oscilloscope for future reference. Log the PC file identification and all pertinent information in test forms.

Repeat the above nine steps for the opposite "third brush". This process must be repeated until the center brushes of all poles have been adjusted to result in maximum mmf's, and maximum fields, at the center of the brush footprint.

Install all center brushes and perform a load test at output current of 100 amps. Observe current flow through centers of the brush footprints and current balance. Record the signal traces for future reference.

Repeat all ten steps to cover the inside and outside brush paths to verify performances equal to center brush path.

Upon completion of the third test, secure the machine and install all of the brushes.

Direct current machines with wave wound armatures can be tested and the brushes adjusted in the manner described above, however, in those cases it dose not expedite the testing and adjusting to perform the second test as part of the procedure.

In d.c. machines (with either wave or lap would armatures) having 2, 6, or 10 poles (or any other number of poles which divided by 2 yields an odd number), the brushes 180 degrees apart are opposite polarity. The brushes of these machines may be adjusted to their optimum positions as follows.

Operate the d.c. machine as a generator at rated speed with the normal current that would flow through each brush when the machine is delivering its rated maximum current.

Select two brushes 180 degrees apart and remove all other brushes. Position the probe 34c to sense the position of the maximum mmf through the brush. Move the brush so that the maximum mmf passes through the brush midway between the leading and trailing ends of the brush. Repeat the prescription just given for the brush 180 degrees from the brush that was just tested. Thereafter, select another set of brushes that are 180 degrees apart. Remove all other brushes and test and adjust these two brushes in the manner described for the first two brushes. Continue to test and adjust two brushes at a time until all brushes are tested and adjusted.

When, during the discussion of the third test, I refer to an mmf aligned with the brush, it should be understood that such mmf is almost entirely the result of the current flowing through the armature.

As stated above the numerous risers 23 of the machine form a cylinder whose center is coaxial with the axis of the machine. Moreover, as shown in FIG. 2, probe 34 has a path concentric with the outer surface of the risers. The space may be one to two millimeters. For the purpose of the third test the probe can be at other positions depending on the construction of the machine under test.

For example, in many machines, the probe 34 (FIGS. 2 and 4) may move in a circle to the left or to the right of the path it moves in FIG. 2.

The purpose of the fourth test is to evaluate the performance of the interpoles and verify balanced armature currents after the air gap field and brush currents positioning are adequately adjusted.

The following instruments are used in this test:
 a. Instrument amplifier 95
 b. Oscilloscopes (Digital 93 and Analog 94)
 c. DC Ammeter 91a
 d. Digital Counter 41.

The test setup is illustrated in FIG. 13.
The following equipment is used during this test:
 a. DC power source 131 rated at the full input power requirement of the test motor 600 amps. at 250 Vdc).
 b. Dynamometer 132 capable of absorbing 200 HP.

The test procedure is as follows:
 a. Set the computer scope 93 to DC, 200 mv./division, 1 ms. and the analog scope 94 to AC, 50 mv./division, 1 ms.
 b. Start and operate the machine at normal operating speed while engaged to the dynamometer.
 c. Gradually apply load to the machine by control of the dynamometer 132 and the d.c. power source 131. Repeat the steps that follow at 25 percent current increments. For each load increment:
  (1) Check maximum current flow at or near the position of the brush set for each pole. Park probe 34a in front of brush face at point where maximum signal peaks are evident in the analog scope 94.
  (2) Verify maximum current flow at the center of the brush footprints for each brush set.
  (3) Verify balanced current flow through the equipotential brushes. Record the signal traces for future reference.
  (4) If tests (2) and (3) do not show satisfactory results, verify the results by repeating the three brush tests that constitutes the third test.
  (5) Observe and record zero signal crossings by use of probe 34 and counter 41 indications.
 d. If zero signal crossings are not evident at the centers of interpoles within the 100 percent load range, the interpole air gap will require correction.

I claim to have invented:

1. The combination of a d.c. machine and apparatus responsive to the magnetic fields in the machine, comprising:

said d.c. machine having (a) casing, (b) a rotatable element located in said casing and having an axis of rotation, the rotatable element including a commutator and an armature, (c) means in said casing for applying a magnetic field to said armature and (d) brushes contacting the periphery of said commutator, a probe inside of said casing, for sensing magnetic fields, at least one of said brushes being adjustable around said periphery independently of at least another one of said brushes, said apparatus including means in said casing, for moving said probe adjacent said one of said brushes and about said axis, in a substantially arcuate path that is in a plane perpendicular to said axis, and means responsive to said probe for indicating variation in the field sensed by said probe.

2. The combination of claim 1, comprising:

said probe being removably mounted on said means for moving said probe, a light source having means for removably mounting it on said means for moving said probe.

3. The combination of claim 2, in which said light source is a laser pointer, and said machine has field poles, said laser pointer including means for pointing a laser beam at points on the field poles of said machine.

4. The combination of claim 1, in which said machine includes an axis of rotation, field poles and an armature; and said apparatus including means for allowing movement of the probe in a direction parallel to said axis of said rotation of said machine, including movement into and out of the space between said field poles and said armature.

5. The combination of claim 1, in which said d.c. machine has a casing, said casing defining one or more holes through it, said means for moving comprising parts that may be readily disassembled and passed through one or more of said holes and then readily reassembled in said casing.

6. The combination of claim 1, comprising:

means, including a digital counter, for indicating the location of the probe along said path.

7. The combination of claim 1, in which said means for moving said probe comprises means for moving the probe along a circular path with its center on said axis.

8. The combination of claim 7, in which said circular path is a complete circle of 360 degrees, said machine having risers that as a group form a substantially cylindrical outer surface, said circle being substantially concentric with said surface.

9. The combination of claim 1, in which said means for moving the probe including means of enabling the brush to be adjusted to a position where the magnetic flux, detected by the probe, is a maximum.

10. The combination of claim 1 in which said d.c. machine includes a plurality of risers forming a cylindrical outer surface, said brush being movable along said commutator, said means for moving said probe comprising means for moving the probe adjacent said risers in order to find the position, adjacent said brush, where the magnetic field sensed by the probe is a maximum.

11. The method of sensing magnetic fields in a d.c. machine, comprising:

providing said machine with an armature, a commutator, field poles and brushes, with said armature and said commutator having an axis of rotation, providing a probe for sensing magnetic fields, providing a casing that encloses said probe, said armature, said commutator, said field poles and said brushes, moving said probe adjacent at least one of said brushes about said axis in a substantially arcuate path, that is perpendicular to said axis, and giving an indication of the strength of the field sensed by said probe.

12. The method of claim 11, comprising:

providing said casing with a hole, providing, in disassembled form, apparatus for performing said step of moving said probe in said path, inserting said disassembled apparatus through said hole and into said casing, and assembling said apparatus in said casing.

13. The method of claim 11, comprising:

providing a digital counter which performs a count as the probe moves along said path, and indicating, in accordance with said count, the location of the probe along said path.

14. The method of claim 11, comprising:

providing said machine with risers with said risers as a group forming a surface of substantially cylindrical shape, moving said probe adjacent said surface along an arc of at least a few angular degrees to find the location of the probe at which the magnetic field adjacent the brushes is substantially at its maximum, moving said brush on said commutator until the midpoint between the leading and trailing ends of the portion of the brush that contacts the commutator is substantially on a line parallel to said axis and which substantially intersects a radial line from said axis to said probe, said step of moving the probe taking place while said armature is rotating and while direct current is flowing through said brush, said commutator, at least one of said risers, and said armature to produce at least a part of the field sensed by said probe.

15. The method of adjusting the brush on a d.c. machine, comprising:

providing said machine with a commutator whose outer surface is substantially cylindrical, providing said machine with risers which taken as a group have a substantially cylindrical outer surface, providing a probe that is movable back and forth adjacent said brush and near to said surface of said risers, providing an indication that varies with the magnitude of the magnetic flux passing through said probe, and moving one or both of the probe and the brush until the probe is positioned to sense the maximum flux and the brush is on a line that is parallel to said axis and which substantially intersects a line that intersects both said probe and said axis.

16. The method of claim 15, in which the step of moving one of the probe and the brush comprises moving both the probe and the brush.

17. The method of claim 15, comprising: moving the probe along a path that is concentric with said outer surface of said risers.

18. The method of claim 17 in which, prior to the step of moving one or both of the probe and brush, the following step is performed:

moving the brush to try to minimize circulating currents in the brush.

19. The method of claim 15 comprising:

providing said d.c. machine with an armature mounted for rotation coaxially with said outer surface, and providing said d.c. machine with field poles positioned to apply a field to said armature, said step of moving one or both the probe and the brush including the step of moving the probe while the armature is rotating and while direct current is flowing through the brush and armature and producing at least a part of the field sensed by said probe.

20. The combination of a d.c. machine and apparatus responsive to magnetic fields produced by the machine, comprising:

said d.c. machine having (a) a casing, (b) rotating means in said casing and having an axis of rotation, (c) field poles in said casing and (d) a brush in said casing; said rotating means comprising an armature, risers and a commutator having a periphery, said field poles passing a magnetic field through said armature, a probe inside of said casing, for sensing magnetic fields, said probe having an output, said apparatus including means for moving said probe adjacent said brush and about said axis, means responsive to the output of said probe for converting the output of the probe into an indication of the amplitude of the magnetic field intercepting said probe, and holding means for holding said brush in a cooperative relation with said commutator and for enabling the position of the brush along said periphery to be adjusted.

* * * * *